United States Patent [19]

Chino

[11] 4,275,263
[45] Jun. 23, 1981

[54] ELECTRICALLY INSULATING STRUCTURALLY STRONG BUSHING ASSEMBLY

[75] Inventor: John J. Chino, Arnold, Md.

[73] Assignee: The United States of America as represented by the Secretary of the Air Force, Washington, D.C.

[21] Appl. No.: 63,510

[22] Filed: Aug. 3, 1979

[51] Int. Cl.³ .............................................. H01B 17/26
[52] U.S. Cl. .............................. 174/152 R; 174/138 D; 308/237 R
[58] Field of Search ............... 174/138 R, 138 D, 151, 174/152 R, 152 G, 153 R; 24/73 S; 16/2; 85/1 C; 308/4 R, 36, 237 R, 237 A, 238, 239; 339/130 R, 130 C; 361/390, 391, 399, 415

[56] References Cited

U.S. PATENT DOCUMENTS

| 1,522,215 | 1/1925 | Wagner | 174/153 R X |
| 1,655,892 | 1/1928 | Colburn | 174/138 D |
| 1,956,869 | 5/1934 | Lipman | 174/152 R |
| 2,216,564 | 10/1940 | Chapman | 174/151 X |
| 3,086,072 | 4/1963 | Forman | 174/138 D |
| 3,413,591 | 11/1968 | Hergenhan | 174/153 R X |

FOREIGN PATENT DOCUMENTS 574115 12/1945 United Kingdom ................ 308/237 R

*Primary Examiner*—Laramie E. Askin
*Attorney, Agent, or Firm*—Donald J. Singer; Arsen Tashjian

[57] ABSTRACT

An electrically insulating, structurally strong bushing assembly for use at the chassis mounting interface of an electronic chassis, especially a Low Power RF chassis requiring a single point electrical ground, includes a specially machined epoxy-glass bushing for electrical insulation with a steel insert for high strength. The epoxy-glass bushing is machined from plate stock with the grain direction running perpendicular to the structural load and includes both inside and outside threads. The steel insert threads into the epoxy-glass bushing which is then threaded into the electronic chassis.

1 Claim, 14 Drawing Figures

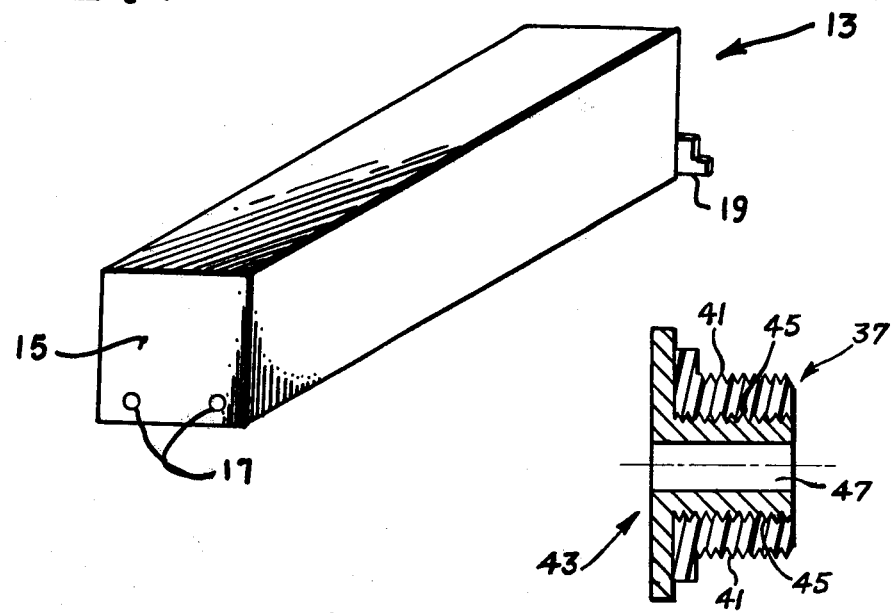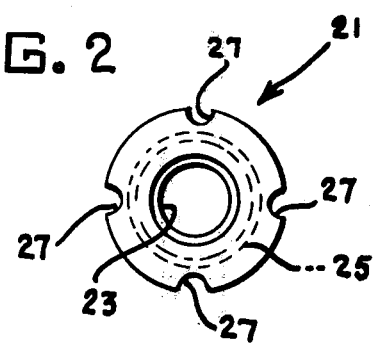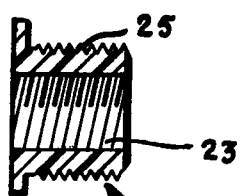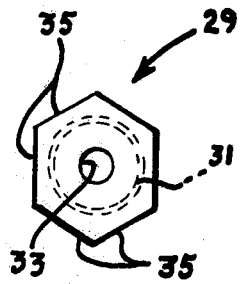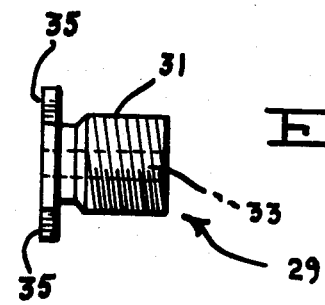

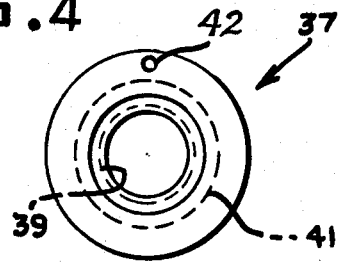
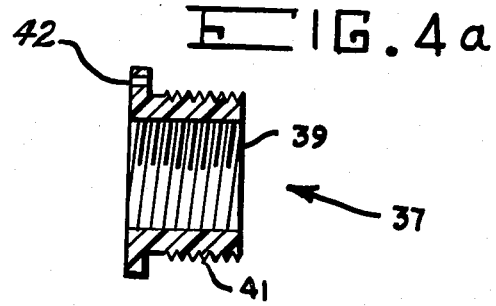
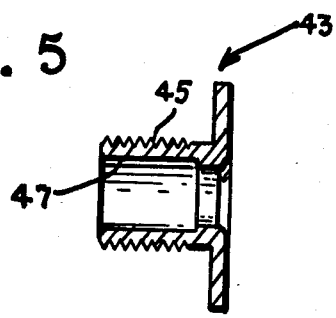
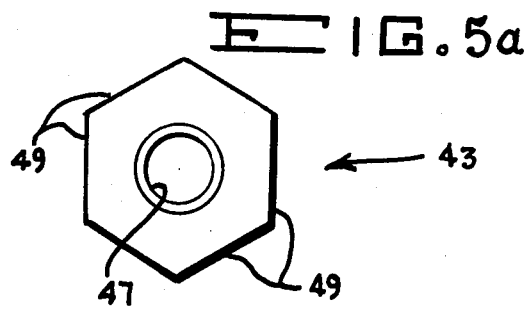
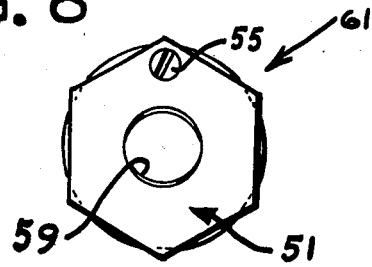
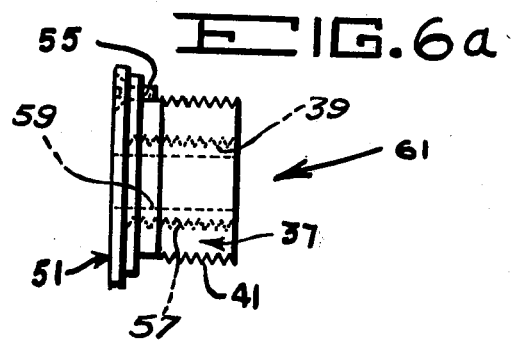
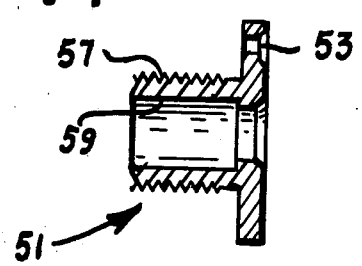
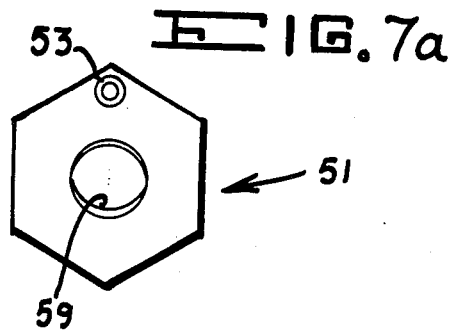

ELECTRICALLY INSULATING STRUCTURALLY STRONG BUSHING ASSEMBLY

STATEMENT OF GOVERNMENT INTEREST

The invention described herein may be manufactured and used by or for the Government for governmental purposes without the payment of any royalty thereon.

BACKGROUND OF THE INVENTION

This invention relates to an electrically insulating structurally strong bushing assembly, for electronic equipment and, more particularly, the invention is concerned with providing an electrically insulating, structurally strong bushing assembly for use at the mounting interface of an electronic chassis requiring a single point electrical ground.

As a general rule, electronic equipment, especially analog type electronics such as the Low Power RF units, cannot tolerate the usual multi-point random type of grounding within the chassis enclosure. This type of uncontrolled grounding results in an increase in electrical noises which is often found to be the reason for the failure of the system phase noise tests. In order to control the ground paths, the ground must be established at only one pre-determined location, usually in the area of the rear guide pin bushings or at the bolted front surface of the chassis. However, this generates a problem with the mounting of the chassis to a radar equipment rack. The chassis mounting points must be able to structurally withstand the vibration and shock environments to which the radar equipment is subjected. These mounting points must also have the capability to withstand the shock impact of the chassis sliding into the rack and being positioned by the steel pins in the rack.

The hereinafter described electrically insulating structurally strong bushing assembly provides a specially machined epoxy-glass bushing which is capable of providing electrical insulation with a steel insert which is capable of providing the required high strength. The epoxy-glass bushings are machined from plate stock with the grain direction running perpendicular to the structural load. This machining specification results in a 60,000 psi allowable bearing load compared to only 30,000 psi for conventional epoxy-glass. With the steel insert in position, this unique bushing assembly permits single point grounding of the chassis while simultaneously being capable of withstanding vibration and shock load inputs to the chassis.

SUMMARY OF THE INVENTION

The present invention is concerned with providing an electrically insulating structurally strong bushing assembly which is particularly useful on a Low Power RF chassis where a single point electrical ground is required. This necessitates an electrically insulating, structurally strong bushing assembly at the chassis mounting interface. In order to accomplish this, epoxy-glass bushings are machined from plate stock with the grain direction running perpendicular to the structural load. The epoxy-glass bushing is then tapped inside and threaded outside. The inside tap allows the threading of an internal steel insert into the bushing while the outside threads permit the entire bushing assembly to be mounted on a radar chassis. Since the steel insert threads directly into the epoxy-glass bushing, it operates to withstand the shock impact of the rack pins as the chassis is inserted into the rack.

Accordingly, it is an object of the invention to provide an electrically insulating structurally strong bushing assembly for use in providing a single point electrical ground for a Low Power RF chassis.

Another object of the invention is to provide an electrically insulating structurally strong bushing assembly wherein a specially machined epoxy-glass bushing is provided with a steel insert to produce an electrically insulating structurally strong bushing assembly at the chassis mounting interface.

Still another object of the invention is to provide an electrically insulating structurally strong bushing assembly including an epoxy-glass bushing with a steel insert. The epoxy-glass bushing is machined from plate stock with the grain direction running perpendicular to the structural load.

A further object of the invention is to provide an electrically insulating structurally strong bushing assembly including an epoxy-glass bushing which is tapped inside and threaded outside. The inside tap allows a steel insert to be threaded into the bushing while the outside threads allow the entire bushing assembly to be mounted on the chassis.

These and other objects, features and advantages will become more apparent after considering the following detailed description taken in conjunction with the annexed drawings and the appended claims.

BRIEF DESCRIPTION OF THE DRAWINGS

FIG. 1 is a representative view in isometric showing the rear mounting points of a radar chassis in which the electrically insulating bushing assemblies according to the invention are installed;

FIGS. 2 and 2a are front and longitudinal cross-sectional views, respectively, of the epoxy-glass bushing according to the invention;

FIGS. 3 and 3a are front and side views, respectively, of the steel insert which fits into the epoxy-glass bushing shown in FIGS. 2 and 2a;

FIGS. 4 and 4a are front and sectional side views, respectively, of another embodiment of the epoxy-glass bushing according to the invention;

FIGS. 5 and 5a are sectional side and front views, respectively, of the steel insert which fits into the epoxy-glass bushing shown in FIGS. 4 and 4a;

FIGS. 6 and 6a are front and side views, respectively, of the electrically insulating structurally strong bushing assembly according to the invention;

FIGS. 7 and 7a are sectional side and front views, respectively, of the steel insert which is shown assembled with the epoxy-glass bushing in FIGS. 6 and 6a; and FIG. 8 is a view in longitudinal cross section of the electrically insulating bushing assembly according to the invention.

DESCRIPTION OF A PREFERRED EMBODIMENT

Referring now to the drawings wherein like reference numerals refer to like elements in the several views, FIG. 1 shows an electronic chassis 13 having a rear wall 15 suitable as a possible location for the chassis ground. A pair of rear chassis mounting points 17 are located on the rear wall 15 of the chassis 13. The chassis 13 also includes front chassis mounting points 19 which are also suitable as a possible chassis ground location.

However, in the present invention, the rear chassis mounting points 17 are utilized for holding the electrically insulating bushing assemblies which mate with the rack pins (not shown).

In FIGS. 2, 2a, 3 and 3a, there is shown one of the electrically insulating bushing assemblies which is suitable for use on the rear wall 15 of the chassis 13 at the mounting points 17. The electricall insulating bushing assembly is made up of two principal parts. The epoxy-glass bushing 21 is shown in FIGS. 2 and 2a and includes a tapped inner hole 23 and a threaded outer surface 25. A series of notches 27 are provided on the outer periphery of the bushing 21 for use during the assembly of the bushing. In FIGS. 3 and 3a, there is shown a steel insert 29 which screws into the epoxy-galss bushing 21. The insert 29 is provided with threads 31 on the outer surface thereof for engagement with the threads 23 in the bushing 21. A central opening 33 is included through the center of the insert 29 for receiving a rack pin (not shown) when the chassis is mounted in the rack. The insert 29 is preferably machined from hexagonal bar stock to provide the flat surfaces 35 for use during assembly of the bushing assembly.

In FIGS. 4 and 4a there is shown another epoxy-glass bushing 37 having a tapped inner hole 39 and a threaded outer surface 41 with a hole 42 through the front surface thereof. In FIGS. 5 and 5a, there is shown a steel insert 43 which screws into the epoxy-glass bushing 37. The insert 43 is provided with threads 45 on the outer surface thereof for engagement with the threads 39 in the bushing 37. A central opening 47 is included through the center of the insert 43 for receiving a rack pin (not shown) when the chassis is mounted in a rack. The insert 43 is manufactured from hexagonal steel bar stock to provide flat surfaces 49 for use during assembly of the bushing assembly.

In FIGS. 6 and 6a there is shown an assembly view of the electrically insulating structurally strong bushing assembly, according to the invention using the steel insert 51 shown in FIGS. 7 and 7a. This steel insert 51 is similar to the insert 43 except that it includes a hole 53 through which flat head screw 55 (shown in FIG. 6a) is passed for engagement with the threaded opening 42 in the epoxy-glass bushing 37. The screw 55 is preferably machined of nylon material and the hole 53 is countersunk to receive the flat head. In the assembly view shown in FIGS. 6 and 6a, the steel insert 51 is screwed into the epoxy-glass bushing 37 by engaging the outside threads 57 on the insert 51 with the inside threads 39 on the bushing 37. The two pieces are then locked together by inserting the screw 55 through the opening 53. The assembled electrically insulating bushing assembly is then threaded into one of the openings 17 in the chassis 13 by the threads 41 and the rack pins (not shown) slide into the central opening 59 when the chassis is installed on the rack.

The epoxy-glass bushings 21 and 37 are machined from plate stock with the grain direction running perpendicular to the structural load. This machining specification results in a 60,000 psi allowable bearing load compared to only 30,000 psi for conventional epoxy-glass bushings. After the steel insert 29, 43 or 51 has been positioned in the epoxy-glass bushing, the bushing assembly 61 is capable of withstanding the shock impact of the rack pins as the chassis 13 is inserted into the rack.

Although the invention has been illustrated in the accompanying drawings and described in the foregoing specification in terms of preferred embodiments thereof, the invention is not limited to these embodiments or to be preferred configurations shown. It will be apparent to those skilled in the art that certain changes, modifications and substitutions can be made with respect to the shape of the elements without departing from the true spirit and scope of the appended claims. As described herein, the electrically insulating structurally strong bushing assembly is particularly useful for mounting various components on a rack in an aircraft for use in a Tail Warning Set radar system. However, it can be seen that the device will have other related uses where a structurally strong electrically insulating bushing assembly is required.

Having thus set forth the nature of my invention, what I claim and desire to secure by Letters Patent of the United States is:

1. An electrically insulating structurally strong bushing assembly for use at the mounting interface of an electronic chassis on a rack, comprising an epoxy-glass bushing having a tapped inner hole through the longitudinal center thereof and a threaded outer surface, said epoxy-glass bushing being fabricated of plate stock with the grain running perpendicular to the structural load to effectively double the allowable bearing load over conventional epoxy-glass, a steel insert having a head portion and threads on the outer surface thereof for engagement with the threads on the tapped inner hole of said bushing, said steel insert having a longitudinal hole through the center thereof for receiving a rack pin therein, and means for locking said steel insert to said epoxy-glass bushing after the insert has been screwed into the bushing including a flat head screw passing through a clearance hole in the head portion of said steel insert and threadably engaging an aligned threaded hole in said epoxy-glass bushing, said flat head screw being fabricated of nylon, thereby allowing the assembled bushing and insert to be threadably attached to an electronic chassis for receiving a rack pin when the chassis is mounted in a rack.

* * * * *